United States Patent
Jeon et al.

(10) Patent No.: US 11,476,116 B2
(45) Date of Patent: Oct. 18, 2022

(54) MANUFACTURING METHOD OF GALLIUM OXIDE THIN FILM FOR POWER SEMICONDUCTOR USING DOPANT ACTIVATION TECHNOLOGY

(71) Applicant: Korea Institute of Ceramic Engineering and Technology, Jinju-si (KR)

(72) Inventors: Dae-Woo Jeon, Jinju-si (KR); Ji-Hyeon Park, Jinju-si (KR)

(73) Assignee: KOREA INSTITUTE OF CERAMIC ENGINEERING AND TECHNOLOGY, Jinju-si (KR)

( * ) Notice: Subject to any disclaimer, the term of this patent is extended or adjusted under 35 U.S.C. 154(b) by 0 days.

(21) Appl. No.: 17/358,284

(22) Filed: Jun. 25, 2021

(65) Prior Publication Data

US 2022/0051892 A1    Feb. 17, 2022

(30) Foreign Application Priority Data

Aug. 13, 2020  (KR) .......... 10-2020-0101681
Dec. 2, 2020   (KR) .......... 10-2020-0166280

(51) Int. Cl.
  *H01L 21/02*   (2006.01)
  *H01L 21/265*  (2006.01)

(52) U.S. Cl.
  CPC .. *H01L 21/02565* (2013.01); *H01L 21/02636* (2013.01); *H01L 21/265* (2013.01)

(58) Field of Classification Search
  None
  See application file for complete search history.

(56) References Cited

U.S. PATENT DOCUMENTS 7,250,627 B2 * 7/2007 Hoffman ............. H01L 29/7869
                                                      257/66

FOREIGN PATENT DOCUMENTS

| CN | 106920849   | A  |   7/2017 |            |
|----|-------------|----|----------|------------|
| CN | 107464844   | A  |  12/2017 |            |
| CN | 111243963   | *  |   6/2020 | H01L 21/44 |
| JP | 2011190134  | *  |   9/2011 | C30B 13/34 |
| JP | WO2013/035843 | A1 |  3/2013 |            |
| JP | 5612216     | B2 |  10/2014 |            |
| JP | 2016-15503  | A  |   1/2016 |            |
| JP | 2017-41593  | A  |   2/2017 |            |
| JP | 2017-218334 | A  |  12/2017 |            |
| JP | 2018-186246 | A  |  11/2018 |            |
| KR | 10-2004-0084941 | A | 10/2004 |            |
| KR | 10-2010-0039782 | A |  4/2010 |            |
| KR | 10-2019-0073978 | A |  6/2019 |            |
| KR | 10-2020-0046623 | A |  5/2020 |            |

\* cited by examiner

Primary Examiner — Alexander G Ghyka
(74) Attorney, Agent, or Firm — Hauptman Ham, LLP

(57) ABSTRACT

Disclosed is a method of manufacturing a gallium oxide thin film for a power semiconductor using a dopant activation technology that maximizes dopant activation effect and rearrangement effect of lattice in a grown epitaxial at the same time by performing in-situ annealing in a growth condition of a nitrogen atmosphere at the same time as the growth of a doped layer is finished.

14 Claims, 9 Drawing Sheets

MANUFACTURING METHOD OF GALLIUM OXIDE THIN FILM FOR POWER SEMICONDUCTOR USING DOPANT ACTIVATION TECHNOLOGY

CROSS-REFERENCE TO RELATED APPLICATION

This application claims priority to and the benefit of Korean Patent Application No. 10-2020-0101681 and 10-2020-0166280, filed on Aug. 13, 2020 and Dec. 2, 2020, the disclosure of which is incorporated herein by reference in its entirety.

TECHNICAL FIELD

The present invention relates to a method of manufacturing a gallium oxide thin film for a power semiconductor using a dopant activation technology, and more particularly, a method of manufacturing a gallium oxide thin film for a power semiconductor using a dopant activation technology capable of maximizing dopant activation effect with rearrangement effect of a lattice in a grown epitaxial by performing an in-situ annealing as it is in a growth condition in a nitrogen atmosphere at the same time as a growth of a doped layer is finished.

DESCRIPTION OF RELATED ART

Conventional Si-based power semiconductor devices have reached the limit of performance improvement compared to technological development due to intrinsic physical property limitations, and the industrial need for power semiconductor materials having wide bandgap (WBG) and ultra-wide bandgap (UWB) characteristics is gradually expanding.

UWB $Ga_2O_3$ material is a wafer for next-generation power semiconductors with price competitiveness as the manufacturing cost is approximately ⅓ to ⅕ compared to GaN or SiC.

In particular, UWB $Ga_2O_3$ material can grow as thin as about ⅓ of the thickness of a thin film to have the same breakdown voltage due to breakdown voltage characteristic by a bandgap, and does not grow at high temperatures, thereby reducing costs.

$Ga_2O_3$ epitaxial technology is a technology that grows a $\beta$-$Ga_2O_3$ single crystal layer of the same type on a $\beta$-$Ga_2O_3$ substrate or an $\alpha$-$Ga_2O_3$ single crystal layer on a heterogeneous substrate such as sapphire. This technology includes a technique for obtaining a high-quality single crystal layer and a doping technique for obtaining an n-type characteristic.

$Ga_2O_3$ material is based on $\beta$-$Ga_2O_3$, the most stable phase, and exists in four other phases ($\alpha$, $\gamma$, $\delta$, $\varepsilon$).

$\beta$-$Ga_2O_3$ is the most stable structure in a high temperature region, and is easy for ingot growth, $\alpha$-$Ga_2O_3$ phase is a relatively stable structure in a low temperature region below 500° C., and all other phases are meta-stable and exist in an unstable state.

$\beta$-$Ga_2O_3$ material has a bandgap of approximately 4.8 to 4.9 eV, and has a monoclinic structure with a lattice constant of the following angles: a=12.124 Å, b=3.037 Å, c=5.798 Å, $\alpha=\gamma=90°$, $\beta=103.83°$.

In the case of $Ga_2O_3$ bulk growth, it grows in a plate shape with an edge-defined film-fed growth (EFG) method for forming $\beta$-$Ga_2O_3$, which is a stable crystal plane at a high temperature, rather than a conventional czochralski method for growing silicon (Si) or sapphire substrates. In the case of such an EFG method, it is difficult to manufacture a substrate having a surface other than $\beta$-$Ga_2O_3$ with bulk growth.

In recent years, a power semiconductor industry has a very large ripple effect on the society as a whole with rapid development, and so far, Si has been applied in various fields as a main element of a power semiconductor industry.

However, at present, the development of information society is further accelerated, and the existing semiconductor process cannot meet the demand, and the physical limitations of Si material are revealed.

In order to solve this problem, research on a new semiconductor material having a wide energy forbidden band (a wide bandgap or a ultra-wide bandgap) has been actively conducted in recent years.

As a related citation, there is Korean Laid-Open Patent Publication No. 10-2010-0039782 (published on Apr. 16, 2010), and the document discloses a method of manufacturing a doped gallium oxide nanowire grown by a thermal evaporation method and a doped gallium oxide nanowire gas sensor and a method of manufacturing the same capable of operating at a room temperature.

DISCLOSURE

Technical Purpose

The object of the present invention is to provide a method of manufacturing a gallium oxide thin film for a power semiconductor using a dopant activation technology that maximizes dopant activation effect with rearrangement effect of a lattice in a grown epitaxial by performing an in-situ annealing as it is in a growth condition of a nitrogen atmosphere at the same time as a growth of a doped layer is finished.

Technical Solution

In order to achieve the objects above, a method of manufacturing a gallium oxide thin film for a power semiconductor using a dopant activation technology according to a first embodiment of the present invention includes the steps of: (a) growing a buffer layer on a substrate; (b) growing a doped layer by flowing a doping gas while growing an alpha gallium oxide thin film on the buffer layer by epitaxial growth; and (c) performing an in-situ annealing of continuously annealing in an $N_2$ or Ar gas atmosphere without a doping gas without being exposed to a room temperature at the same time as a formation of the doped layer is finished. In the step (b), a doping temperature is 400 to 800° C., and a doping gas supplies 5 to 20 sccm using 2,000 ppm $SiH_4$ gas, and, in the step (c), the in-situ annealing is performed for 1 to 20 minutes under a condition of 400 to 800° C. in the same $N_2$ or Ar gas atmosphere as the doping treatment.

Here, the substrate uses a material different from the alpha gallium oxide thin film.

The substrate preferably includes any one selected from $\beta$-$Ga_2O_3$, sapphire, and a heterogeneous substrate capable of epitaxial growth.

In the step (b), the epitaxial growth is performed under a condition of a source temperature of 450 to 650° C. and a growth temperature of 400 to 800° C. in the $N_2$ or Ar gas atmosphere.

After the step (c), the alpha gallium oxide thin film has a carrier mobility of 3 to 50 $cm^2/V\cdot s$.

In order to achieve the objects above, a method of manufacturing a gallium oxide thin film for a power semiconductor using a dopant activation technology according to a second embodiment of the present invention includes the steps of: (a) growing a buffer layer on a substrate; (b) growing a first growth of an alpha gallium oxide thin film on the buffer layer by epitaxial growth; (c) growing a doped layer by flowing a doping gas while performing a second growth of the first grown alpha gallium oxide thin film; and (d) performing an in-situ annealing of continuously annealing in an $N_2$ or Ar gas atmosphere without a doping gas without being exposed to a room temperature at the same time as a formation of the doped layer is finished. In the step (c), a doping temperature is 400 to 800° C., and a doping gas supplies 5 to 20 sccm using 2,000 ppm $SiH_4$ gas, and, in the step (d), the in-situ annealing is performed for 1 to 20 minutes under a condition of 400 to 800° C. in the same $N_2$ or Ar gas atmosphere as the doping treatment.

Here, the substrate preferably includes any one selected from $\beta$-$Ga_2O_3$, sapphire, and a heterogeneous substrate capable of epitaxial growth.

In the step (b), the epitaxial growth is performed under a condition of a source temperature of 450 to 650° C. and a growth temperature of 400 to 800° C. in the $N_2$ or Ar gas atmosphere.

In the step of (c), the doping treatment supplies the doping gas under the same condition as a growth condition of an un-doped alpha gallium oxide thin film.

After the step (d), the alpha gallium oxide thin film has a carrier mobility of 3 to 50 $cm^2/V \cdot s$.

In order to achieve the objects above, a method of manufacturing a gallium oxide thin film for a power semiconductor using a dopant activation technology according to a second embodiment of the present invention includes the steps of: (a) growing a buffer layer on a substrate of a material different from an alpha gallium oxide thin film; (b) growing a first growth of the alpha gallium oxide thin film on the buffer layer by epitaxial growth under a condition of a growth temperature of 400 to 800° C.; (c) growing a doped layer by flowing a doping gas in an $N_2$ or Ar gas atmosphere under a condition of a doping temperature of 400 to 800° C. while performing a second growth of the first grown alpha gallium oxide thin film; and (d) performing an in-situ annealing of continuously annealing for 1 to 20 minutes under a condition of 400 to 800° C. in the $N_2$ or Ar gas atmosphere without a doping gas without being exposed to a room temperature at the same time as a formation of the doped layer is finished. In the step (c), the doping gas supplies 5 to 20 sccm using 2,000 ppm $SiH_4$ gas.

Here, the substrate preferably includes any one selected from $\beta$-$Ga_2O_3$, sapphire, and a heterogeneous substrate capable of epitaxial growth.

In the step (b), the epitaxial growth is performed under a condition of a source temperature of 450 to 650° C. and a growth temperature of 400 to 800° C. in the $N_2$ or Ar gas atmosphere.

After the step (d), the alpha gallium oxide thin film has a carrier mobility of 3 to 50 $cm^2/V \cdot s$.

Technical Effects

The method of manufacturing a gallium oxide thin film for a power semiconductor using a dopant activation technology according to the present invention can maximize dopant activation effect with rearrangement effect of a lattice in a grown epitaxial by performing an in-situ annealing as it is in a growth environment of a nitrogen atmosphere at the same time as a growth of a doped layer is finished.

As a result, since the gallium oxide thin film for a power semiconductor manufactured by the method according to the present invention can maintain the condition without change on the surface of the thin film after the in-situ annealing, the problem that carrier mobility and concentration become unstable can be prevented in advance.

Therefore, the gallium oxide thin film for a power semiconductor manufactured by the method according to the present invention has a carrier mobility of 3 to 50 $cm^2/V \cdot s$.

In addition, the method of manufacturing a gallium oxide thin film for a power semiconductor using a dopant activation technology according to the present invention grows an alpha gallium oxide thin film by epitaxial growth, and at the same time flows a doping gas to perform a doping treatment, followed by an in-situ annealing to form a stable n-type gallium oxide, so that the process can be simplified.

BRIEF DESCRIPTIONS OF DRAWINGS

DETAILED DESCRIPTIONS

Figure 1:
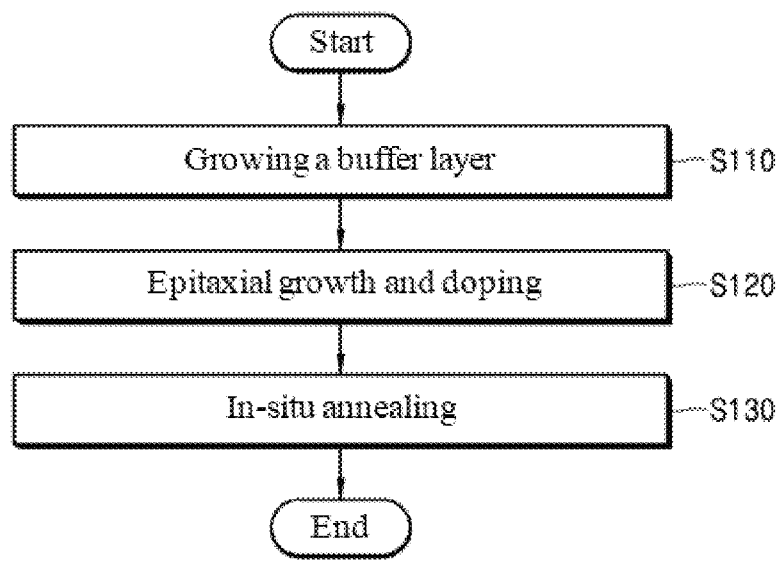
FIG. 1 is a process flow diagram showing a method of manufacturing a gallium oxide thin film for a power semiconductor according to a first embodiment of the present invention.

Advantages and features of the present invention, and a method of achieving them will become apparent with reference to the embodiments described later in detail together with the accompanying drawings. However, the present invention is not limited to the embodiments disclosed below, but will be implemented in a variety of different forms. This embodiment is provided to complete the disclosure of the present invention, and to fully inform the scope of the invention to those skilled in the art to which the present invention pertains, and the present invention is only defined by the scope of the claims. The same reference numerals refer to the same elements throughout the specification.

Hereinafter, a method of manufacturing a gallium oxide thin film for a power semiconductor using a dopant activation technology according to a preferred embodiment of the present invention will be described in detail with reference to the accompanying drawings.

First Embodiment

Figure 2:
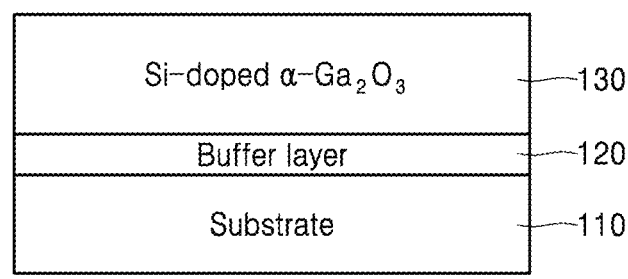
FIG. 2 is a cross-sectional view showing a gallium oxide thin film structure for a power semiconductor manufactured by a method according to a first embodiment of the present invention.

FIG. 1 is a process flow diagram showing a method of manufacturing a gallium oxide thin film for a power semiconductor according to a first embodiment of the present invention, FIG. 2 is a cross-sectional view showing a gallium oxide thin film structure for a power semiconductor manufactured by a method according to a first embodiment of the present invention.

Referring to FIGS. 1 and 2, a method of manufacturing a gallium oxide thin film for a power semiconductor using a dopant activation technology according to a first embodiment of the present invention includes a step (S110) for growing a buffer layer, a step (S120) for an epitaxial growth and doping, and a step (S130) for an in-situ annealing.

Growing a Buffer Layer

In the step for growing a buffer layer (S110), a buffer layer (120) is grown on a substrate (110).

Here, it is preferable that a material different from the alpha gallium oxide thin film is used as the substrate (110).

To this end, the substrate (110) may include any one selected from $\beta$-$Ga_2O_3$, sapphire, and a heterogeneous substrate capable of epitaxial growth, among which sapphire is more preferable.

In this case, the buffer layer (120) may be grown on the etched substrate (110). Etching is preferably performed for 5 to 15 minutes at an etching temperature of 300 to 700° C. If the etching temperature is less than 300° C. or the etching time is less than 5 minutes, it may be difficult to secure surface properties. On the contrary, if the etching temperature exceeds 700° C. or the etching time exceeds 15 minutes, it is not economical because it can act as a factor that increases only the manufacturing cost without further advantageous effects.

In this step, the buffer layer (120) may be grown by depositing GaCl on the etched substrate (110). That is, as a reaction of exposing the gallium source to HCl on the etched substrate (110), GaCl is deposited for 5 to 10 minutes at the condition of 400 to 700° C. to form the buffer layer (120). Here, since the gallium source and HCl generate GaCl and $GaCl_3$ depending on the temperature, the source temperature must be properly maintained. In addition, since the deposition of the buffer layer using GaCl is a process for nucleation in the subsequent formation of a gallium oxide thin film, it is one of the factors that significantly affects the crystalline quality of the thin film.

Epitaxial Growth and Doping

In the step (S120) for epitaxial growth and doping, the doped layer (130) is grown by performing a doping gas while growing an alpha gallium oxide thin film by epitaxial growth on the buffer layer (120).

As described above, in this step, since the doped layer (130) is grown in a manner in which the alpha gallium oxide thin film is grown by the epitaxial growth and the doping treatment is performed by flowing a doping gas, a process can be simplified.

Here, the doped layer (130) may be a Si-doped $\alpha$-$Ga_2O_3$ thin film, but is not limited thereto.

In this step, the epitaxial growth is preferably carried out under conditions of a source temperature of 450 to 650° C. and a growth temperature of 400 to 800° C. in an $N_2$ or Ar gas atmosphere.

In this step, during growth, it is preferable to supply a deposition gas under conditions of 1 to 50 sccm of GaCl and 100 to 400 sccm of $O_2$. Here, the conditions for flowing the deposition gas may vary depending on the capacity of the main chamber of the equipment, and the VI/III ratio may be changed from 2 to 1,000.

If the flow rate of GaCl is less than 1 sccm, there is a problem of lowering a production yield due to the low flow rate of GaCl resulting in a lower growth rate. Conversely, if the flow rate of GaCl exceeds 50 sccm, there is a concern that surface properties are deteriorated and particles become large, so that the thickness of the Si-doped $\alpha$-$Ga_2O_3$ thin film (130) is excessively increased.

In addition, if the flow rate of $O_2$ is less than 100 sccm, there is a problem of lowering a production yield because the flow rate of $O_2$ is small and the growth rate is lowered. On the contrary, if the flow rate of $O_2$ exceeds 400 sccm, there is a concern that surface characteristics are deteriorated and particles become large, and thus the thickness of the Si-doped $\alpha$-$Ga_2O_3$ thin film (130) is excessively increased.

In addition, in this step, if the source temperature is less than 450° C., there is a problem that a growth rate is lowered due to the low temperature. Conversely, if the source temperature exceeds 650° C., there is a problem in that surface properties are deteriorated and particles become large, and the thickness of the Si-doped $\alpha$-$Ga_2O_3$ thin film (130) is excessively increased.

In addition, if the growth temperature is less than 400° C., there is a problem that a growth rate is lowered due to the low temperature. On the contrary, if the growth temperature exceeds 800° C., the growth rate increases, but there is a problem in that surface characteristics are deteriorated due to the excessive growth temperature.

In this step, the pressure is preferably carried out in a state that is kept constant under normal pressure conditions.

As described above, the growth of the doped layer is performed by flowing a doping gas at the same time as the epitaxial growth. Therefore, the doping temperature is preferably 400 to 800° C. During such doping treatment, n-type impurities may be doped, but is not limited thereto. For example, for the doping of n-type impurities, it is more preferable to supply 1 to 20 sccm as the doping gas using 2,000 ppm of $SiH_4$ gas. Here, the injected gas amount may be applied differently depending on the concentration of the prepared gas. That is, the gas concentration and gas amount may vary depending on the reaction reactor of the HVPE equipment.

In-Situ Annealing

In the step for in-situ annealing, the in-situ annealing of annealing is performed in an $N_2$ or Ar gas atmosphere without a doping gas without being exposed to a room temperature at the same time as the formation of the doped layer (130) is terminated. Here, the room temperature may be −10 to 40° C., but is not limited thereto.

In a general annealing process, the alpha gallium oxide thin film on which the dopant layer is formed is taken out to a room temperature for dopant activation and heat-treated in a furnace.

However, if the general annealing process is applied for dopant activation, the dopant activation effect is insignificant, and thus the carrier concentration and carrier mobility of the alpha gallium oxide thin film on which the dopant layer is formed may become unstable.

That is, in the case of α-Ga$_2$O$_3$ thin film grown at a temperature of about 800° C. or less, more specifically 500° C. or less, after epitaxial growth, it is taken out to a room temperature and then introduced into the furnace. In the general annealing process or rapid heat treatment (RTA) process, defects occur on the surface of the thin film even if it is raised to a temperature exceeding the growth temperature and exposed for a certain period of time. In addition, at a temperature of 800° C. or less, more specifically 500° C. or less, it is difficult to expect a defect reduction effect, and the dopant activation effect may be halved due to insufficient activation energy.

In order to prevent the problem in advance, in the present invention, at the same time as the growth of the doped layer (130) is finished, the in-situ annealing is performed as it is in the growth environment of the same nitrogen atmosphere as the doping treatment. Thus, the dopant activation effect is maximized at the same time as the rearrangement effect of the lattice in the grown epitaxial.

To this end, the in-situ annealing is performed in the same N$_2$ or Ar gas atmosphere as the doping treatment, at 400 to 800° C., which is the same temperature as the growth temperature, for 1 to 30 minutes, more preferably 1 to 20 minutes. Here, the in-situ annealing time may be applied differently depending on the thickness to be grown and the amount of doping.

If the in-situ annealing treatment temperature is less than 400° C. or the in-situ annealing treatment time is less than 1 minute, it is difficult to properly exhibit the dopant activation effect. Conversely, if the in-situ annealing treatment temperature exceeds 800° C. or the in-situ annealing treatment time exceeds 30 minutes, defects may occur on the surface of the thin film. Even though the in-situ annealing treatment temperature and time have increased. Rather, there is a problem in that carrier concentration and carrier mobility are lowered.

As discussed so far, in the method for manufacturing a gallium oxide thin film for a power semiconductors using a dopant activation technology according to the first embodiment of the present invention, the in-situ annealing is performed as it is in the growth environment of the N$_2$ or Ar gas atmosphere at the same time as the growth of the doped layer is finished, and thus, it is possible to maximize the rearrangement effect of the lattice in the grown epitaxial and the dopant activation effect at the same time.

As a result, since the gallium oxide thin film for a power semiconductor manufactured by the method according to the first embodiment of the present invention can be maintained in the condition at the time of growth without change on the surface of the thin film after in-situ annealing, the problem of unstable carrier mobility and concentration can be prevented in advance.

Therefore, the gallium oxide thin film for a power semiconductor manufactured by the method according to the embodiment of the present invention has a carrier mobility of 3 to 50 cm$^2$/V·s.

In addition, in the method of manufacturing a gallium oxide thin film for a power semiconductor using a dopant activation technology according to the first embodiment of the present invention, at the same time as the alpha gallium oxide thin film is grown by epitaxial growth, a doping treatment is performed by flowing a doping gas, followed by in-situ annealing to form a stable n-type gallium oxide, so that the process can be simplified.

Second Embodiment

Figure 3:
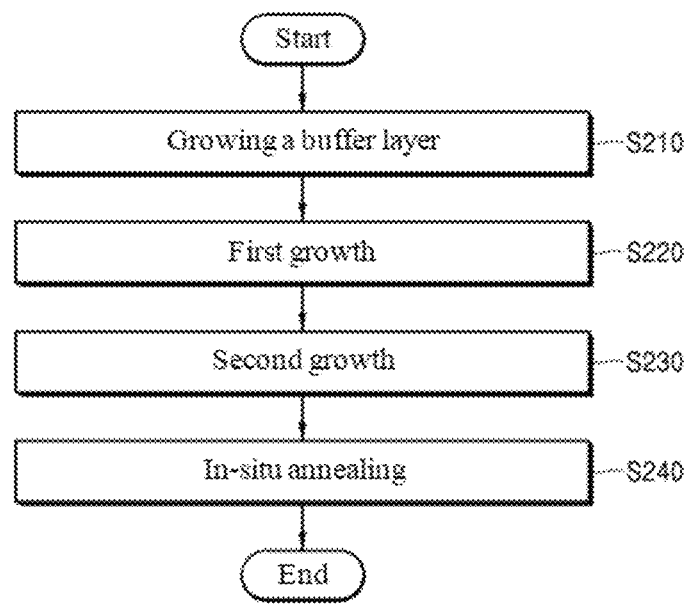
FIG. 3 is a process flow diagram showing a method of manufacturing a gallium oxide thin film for a power semiconductor according to a second embodiment of the present invention.
Figure 4:
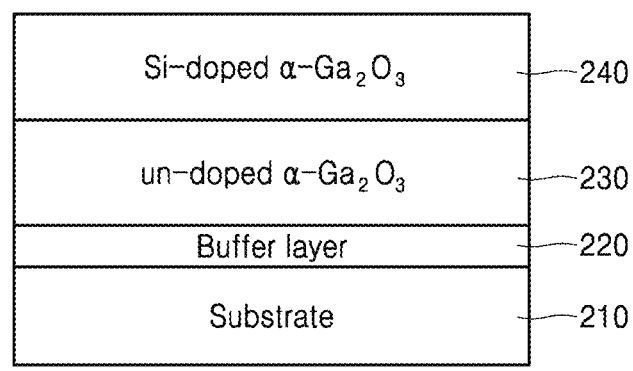
FIG. 4 is a cross-sectional view showing a gallium oxide thin film structure for a power semiconductor manufactured by a method according to a second embodiment of the present invention.

FIG. 3 is a process flow diagram showing a method of manufacturing a gallium oxide thin film for a power semiconductor according to a second embodiment of the present invention, and FIG. 4 is a cross-sectional view showing a gallium oxide thin film structure for a power semiconductor manufactured by a method according to a second embodiment of the present invention.

Referring to FIGS. 3 and 4, a method of manufacturing a gallium oxide thin film for a power semiconductor using a dopant activation technology according to a second embodiment of the present invention includes a step (S210) for growing a buffer layer, a step (S220) for first growth, a step (S230) for second growth and a step (S240) for an in-situ annealing.

Growing a Buffer Layer

In the step (S210) for growing a buffer layer, a buffer layer (220) is grown on a substrate (210).

Here, it is preferable that a material different from the alpha gallium oxide thin film is used as the substrate (210).

To this end, the substrate (210) may include any one selected from β-Ga$_2$O$_3$, sapphire, and a heterogeneous substrate capable of epitaxial growth, among which sapphire is more preferable.

In this case, the buffer layer (220) may be grown on the etched substrate (210). Etching is preferably performed for 5 to 15 minutes at an etching temperature of 300 to 700° C. If the etching temperature is less than 300° C. or the etching time is less than 5 minutes, it may be difficult to secure surface properties. On the contrary, if the etching temperature exceeds 700° C. or the etching time exceeds 15 minutes, it is not economical because it can act as a factor that increases only the manufacturing cost without further increased advantageous effect.

In this step, the buffer layer (220) may be grown by depositing GaCl on the etched substrate (210). That is, as a reaction of exposing the gallium source to HCl on the etched substrate (210), GaCl is deposited for 5 to 10 minutes at 400 to 700° C. to form the buffer layer (220). Here, since the gallium source and HCl generate GaCl and GaCl$_3$ depending on the temperature, the source temperature must be properly maintained. In addition, since the deposition of the buffer layer using GaCl is a process for nucleation in the subsequent formation of a gallium oxide thin film, it is one of the factors that significantly affects the crystalline quality of the thin film.

First Growth

In the step (S220) for first growth, an alpha gallium oxide thin film (230) is first grown by epitaxial growth on the buffer layer (220).

As described above, in the second embodiment of the present invention, doping treatment is not performed during the first growth. Accordingly, the un-doped alpha gallium oxide thin film (230) may be an un-doped α-Ga$_2$O$_3$ thin film, that is, a pure α-Ga$_2$O$_3$ thin film, but is not limited thereto.

In this step, the epitaxial growth is preferably carried out under conditions of a source temperature of 450 to 650° C. and a growth temperature of 400 to 800° C. in an N$_2$ or Ar gas atmosphere.

In this step, during growth, it is preferable to supply a deposition gas under conditions of 1 to 50 sccm of GaCl and 100 to 400 sccm of O$_2$. Here, the conditions for flowing the deposition gas may vary depending on the capacity of the main chamber of the equipment, and VI/III ratio may be applied by varying from 2 to 1,000.

If the flow rate of GaCl is less than 1 sccm, there is a problem of lowering a production yield due to the low flow rate of GaCl resulting in a lower growth rate. On the contrary, if the flow rate of GaCl exceeds 50 sccm, there is a concern that surface properties are deteriorated and particles become large, and the thickness of the alpha gallium oxide thin film (230) is excessively increased.

In addition, if the flow rate of $O_2$ is less than 100 sccm, there is a problem of lowering a production yield because the flow rate of $O_2$ is small and a growth rate is lowered. On the contrary, if the flow rate of $O_2$ exceeds 400 sccm, there is a concern that surface properties are deteriorated and particles become large, thereby excessively increasing the thickness of the alpha gallium oxide thin film (230).

In addition, in this step, if the source temperature is less than 450° C., there is a problem that a growth rate is lowered due to the low temperature. Conversely, if the source temperature exceeds 650° C., there is a problem in that surface properties are deteriorated and particles become large, and the thickness of the alpha gallium oxide thin film (230) is excessively increased.

In addition, if the growth temperature is less than 400° C., there is a problem that a growth rate is lowered due to the low temperature. Conversely, if the growth temperature exceeds 800° C., the growth rate increases, but there is a problem in that surface characteristics are deteriorated due to the excessive growth temperature.

In this step, the pressure is preferably carried out in a state that is kept constant under a normal pressure condition.

Second Growth

In the step (S230) for second growth, a doped layer (240) is grown by flowing a doping gas while the first grown alpha gallium oxide thin film (230) is secondarily grown.

In this step, in the doping treatment, it is preferable to supply a doping gas under the same conditions as the growth conditions of the un-doped alpha gallium oxide thin film (230). That is, the doping treatment is preferably performed under the doping temperature of 400 to 800° C. in the same $N_2$ gas atmosphere as the growth conditions of the un-doped alpha gallium oxide thin film 230.

Here, the doped layer (240) may be a Si-doped $\alpha$-$Ga_2O_3$ thin film, but is not limited thereto.

During such doping treatment, n-type impurities may be doped, but is not limited thereto.

For example, for the doping of n-type impurities, it is more preferable to supply 1 to 20 sccm as the doping gas using 2,000 ppm of $SiH_4$ gas. Here, the injected gas amount may be applied differently depending on the concentration of the prepared gas. That is, the gas concentration and gas amount may vary depending on the reaction reactor of the HVPE equipment.

In-Situ Annealing

In the step (S240) for in-situ annealing, the formation of the doped layer (240) is finished and at the same time, the in-situ annealing in which the annealing is performed in the same $N_2$ or Ar gas atmosphere as the doping treatment without being exposed to a room temperature.

As described above, in the second embodiment of the present invention, an un-doped (unintentionally-doped layer) $\alpha$-$Ga_2O_3$ thin film is first grown before the doped layer (240) is formed, and the doped layer (240) of Si-doped $\alpha$-$Ga_2O_3$ thin film is sequentially regrown, and then, in-situ annealing is performed at the same time as the formation of the doped layer (240) is finished. Thus, it may be possible to implement a lower level of carrier concentration while further improving carrier mobility by defect reduction.

In a general annealing process, the alpha gallium oxide thin film on which the dopant layer is formed is removed to a room temperature and heat-treated in a furnace to activate the dopant.

However, if a general annealing process is applied for dopant activation, the dopant activation effect is insignificant, and thus the carrier concentration and carrier mobility of the alpha gallium oxide thin film on which the dopant layer is formed may become unstable.

That is, in the case of $\alpha$-$Ga_2O_3$ thin film grown at a temperature of about 800° C. or less, more specifically 500° C. or less, after epitaxial growth, it is taken out to a room temperature and then introduced into a furnace. In the general annealing process or rapid heat treatment (RTA) process, defects occur on the surface of the thin film even if it is raised to a temperature exceeding the growth temperature and exposed for a certain period of time. In addition, at a temperature of 800° C. or less, more specifically 500° C. or less, it is difficult to expect a defect reduction effect, and the dopant activation effect may be halved due to insufficient activation energy.

In order to prevent such a problem in advance, in the present invention, at the same time as the growth of the doped layer 240 is finished, the in-situ annealing is performed in the growth environment of the same $N_2$ or Ar gas atmosphere as the doping treatment. As a result, both the rearrangement effect of the lattice in the grown epitaxial and the dopant activation effect are maximized at the same time.

To this end, the in-situ annealing is preferably performed in the same $N_2$ or Ar gas atmosphere as the doping treatment, at 400 to 800° C., which is the same temperature as the growth temperature, for 1 to 30 minutes. Here, the in-situ annealing time may be applied differently depending on the thickness to be grown and the amount of doping.

If the in-situ annealing treatment temperature is less than 400° C. or the in-situ annealing treatment time is less than 1 minute, it is difficult to properly exhibit the dopant activation effect. On the contrary, if the in-situ annealing treatment temperature exceeds 800° C. or the in-situ annealing treatment time exceeds 30 minutes, defects may occur on the thin film surface. Although the in-situ annealing treatment temperature and time are increased, there is a problem that the carrier concentration and carrier mobility are lowered.

As discussed so far, in the method for manufacturing a gallium oxide thin film for a power semiconductor using a dopant activation technology according to the second embodiment of the present invention, an un-doped (unintentionally-doped layer) $\alpha$-$Ga_2O_3$ thin film is first formed before forming a doped layer. the doped layer of Si-doped $\alpha$-$Ga_2O_3$ thin film is subsequently regrown, and then the in-situ annealing is performed at the same time as the formation of the doped layer is finished. Thus, it may be possible to implement a low level of carrier concentration while further improving the carrier mobility by defect reduction.

Therefore, in the method of manufacturing a gallium oxide thin film for a power semiconductor using the dopant activation technology according to the second embodiment of the present invention, at the same time as the growth of the doped layer is finished, the in-situ annealing is performed as it is in the growth environment of the nitrogen atmosphere. Thus, it is possible to maximize the rearrangement effect of the lattice in the grown epitaxial and the dopant activation effect at the same time.

As a result, since the gallium oxide thin film for a power semiconductor manufactured by the method according to the second embodiment of the present invention can be maintained in the condition without change on the surface of the thin film after in-situ annealing, it is possible to prevent the problem that the carrier mobility and the concentration becomes unstable.

Therefore, the gallium oxide thin film for a power semiconductor manufactured by the method according to the second embodiment of the present invention has a carrier mobility of 3 to 50 cm$^2$/V·s.

In the above-described embodiment of the present invention, a method of manufacturing a gallium oxide thin film for a power semiconductor using a dopant activation technology has been described, but the present invention is not limited thereto. That is, in the embodiment of the present invention, the dopant activation technology can be applied equally to the method of manufacturing the beta gallium oxide thin film as well as the method of manufacturing the alpha gallium oxide thin film. In this case, it is preferable to form a beta gallium oxide thin film by epitaxial growth on a substrate of the same material as the beta gallium oxide thin film. Therefore, it can be said to belong to the present invention as long as it does not depart from the scope of the technical idea provided by the present invention.

EXAMPLES

Hereinafter, the configuration and operation of the present invention will be described in more detail through a preferred embodiment of the present invention. However, this has been presented as a preferred example of the present invention and cannot be construed as limiting the present invention in any sense.

Contents not described herein can be sufficiently technically inferred by those skilled in the art, and thus description thereof will be omitted.

1. Preparation of Alpha Gallium Oxide Thin Film

Example 1

After etching the surface of a sapphire substrate at an etching temperature of 400° C. for 10 minutes, GaCl was deposited for 7 minutes by exposing the gallium source to HCl to form a buffer layer.

Next, in a state in which the substrate on which the buffer layer was grown was exposed to the N$_2$ gas atmosphere, a deposition gas was supplied under the conditions of a source temperature of 470° C., a growth temperature of 470° C., 10 sccm of HCl, and 200 sccm of O$_2$, and at the same time, 10 sccm of SiH$_4$ was supplied for doping and grown for 10 minutes to form a Si-doped α-Ga$_2$O$_3$ thin film (doped layer).

Next, at the same time as the formation of the doped layer was finished, the in-situ annealing was performed for 20 minutes under the same temperature condition as the growth temperature in the same N$_2$ gas atmosphere as the doping treatment.

Example 2

During the doping treatment, an alpha gallium oxide thin film was prepared in the same manner as in Example 1, except that 5 sccm of SiH$_4$ was supplied.

Example 3

During the in-situ annealing, an alpha gallium oxide thin film was prepared in the same manner as in Example 2, except that it was performed for 15 minutes.

Example 4

During the in-situ annealing, an alpha gallium oxide thin film was prepared in the same manner as in Example 2, except that it was performed for 30 minutes.

Example 5

After etching the surface of a sapphire substrate at an etching temperature of 400° C. for 10 minutes, GaCl was deposited for 7 minutes by exposing the gallium source to HCl to form a buffer layer.

Next, in a state in which the substrate on which the buffer layer was grown was exposed to an N$_2$ gas atmosphere, a deposition gas was supplied under the conditions of a source temperature of 470° C., a growth temperature of 470° C., 10 sccm of HCl, and 200 sccm of O$_2$ to form an α-Ga$_2$O$_3$ thin film (un-doped α-Ga$_2$O$_3$ thin film) was formed.

Next, a Si-doped α-Ga$_2$O$_3$ thin film (doped layer) was grown by growing the same as the growth conditions of the α-Ga$_2$O$_3$ thin film for the growth of the doped layer, and at the same time growing for 10 minutes while supplying 10 sccm of SiH$_4$ for doping.

Next, at the same time as the formation of the doped layer was finished, the in-situ annealing was performed for 10 minutes under the same temperature condition as the growth temperature in the same N$_2$ gas atmosphere as the doping treatment.

Comparative Example 1

After etching the surface of a sapphire substrate at an etching temperature of 400° C. for 10 minutes, GaCl was deposited for 7 minutes by exposing the gallium source to HCl to form a buffer layer.

Next, in a state in which the substrate on which the buffer layer was grown was exposed to an N$_2$ gas atmosphere, a deposition gas was supplied under the conditions of a source temperature of 470° C., a growth temperature of 470° C., 10 sccm of HCl, and 200 sccm of O$_2$, at the same time growing for 10 minutes while supplying 10 sccm of SiH$_4$ for doping to form a Si-doped α-Ga$_2$O$_3$ thin film (un-doped layer).

Next, the α-Ga$_2$O$_3$ thin film on which the doped layer was formed was cooled to a room temperature (15° C.) by natural cooling.

Comparative Example 2

After etching the surface of a sapphire substrate at an etching temperature of 400° C. for 10 minutes, GaCl was deposited for 7 minutes by exposing the gallium source to HCl to form a buffer layer.

Next, in a state in which the substrate on which the buffer layer was formed was exposed to an N$_2$ gas atmosphere, a deposition gas was supplied under the conditions of a source temperature of 470° C., a growth temperature of 470° C., 10 sccm of HCl, and 200 sccm of O$_2$, at the same time growing for 10 minutes while supplying 10 sccm of SiH$_4$ for doping to form a Si-doped α-Ga$_2$O$_3$ thin film (un-doped layer).

Next, after the substrate on which the doped layer was formed was taken out, annealing was performed for 20 minutes at 470° C. in a state in which it was put into a general heat treatment apparatus.

Comparative Example 3

After etching the surface of a sapphire substrate at an etching temperature of 400° C. for 10 minutes, GaCl was deposited for 7 minutes by exposing the gallium source to HCl to form a buffer layer.

Next, in a state in which the substrate on which the buffer layer was grown was exposed to an $N_2$ gas atmosphere, a deposition gas was supplied under the conditions of a source temperature of 470° C., a growth temperature of 470° C., 10 sccm of HCl, and 200 sccm of $O_2$, at the same time growing for 10 minutes while supplying 10 sccm of $SiH_4$ for doping to form a Si-doped $\alpha$-$Ga_2O_3$ thin film.

Next, the Si-doped $\alpha$-$Ga_2O_3$ thin film was taken out at a room temperature (15° C.) and transferred to a rapid heat treatment furnace, and then the temperature was raised to 750° C. at a rate of 10° C./sec, and then rapid heat treatment was performed at 750° C. for 10 minutes.

2. Property Evaluation

Figure 5A:
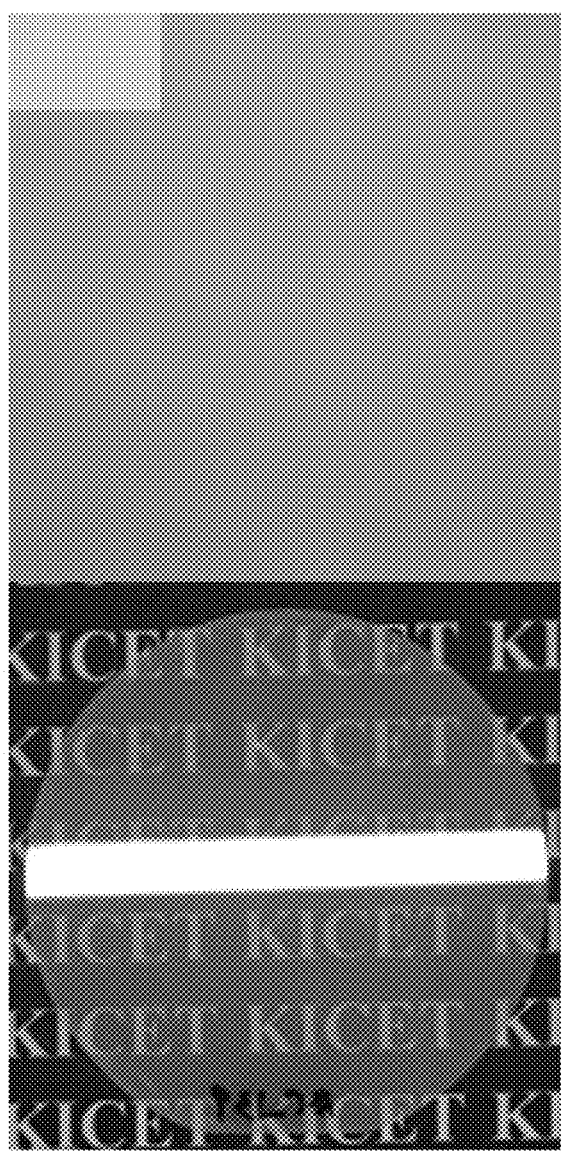
FIGS. 5A to 5C are OM and measurement photographs taken by photographing the alpha gallium oxide thin film prepared according to Example 1 and Comparative Examples 1 to 2.
Figure 5B:
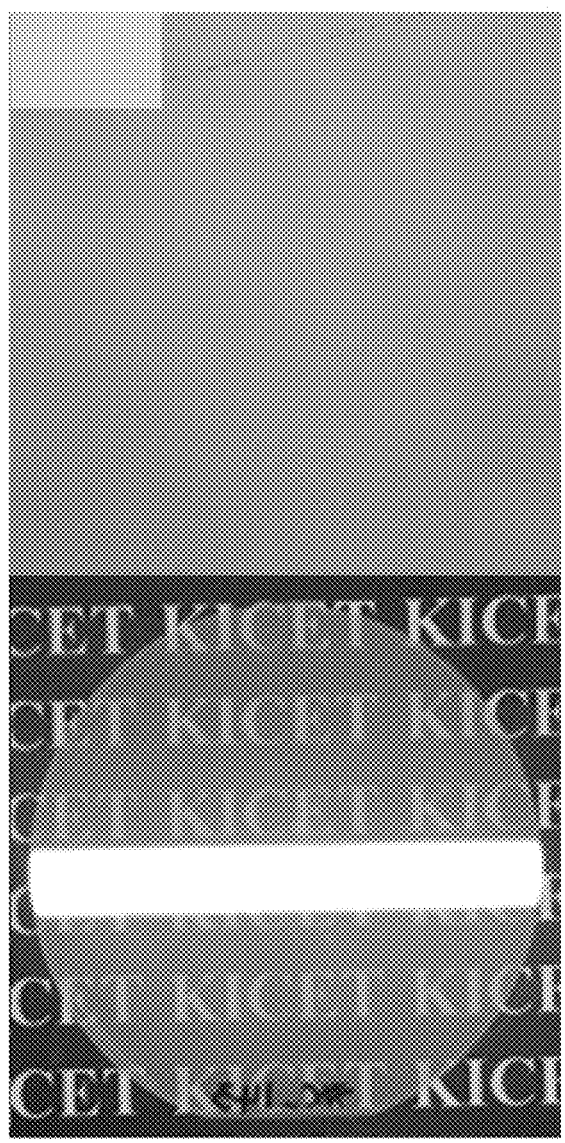
Figure 5C:
Figure 6A:
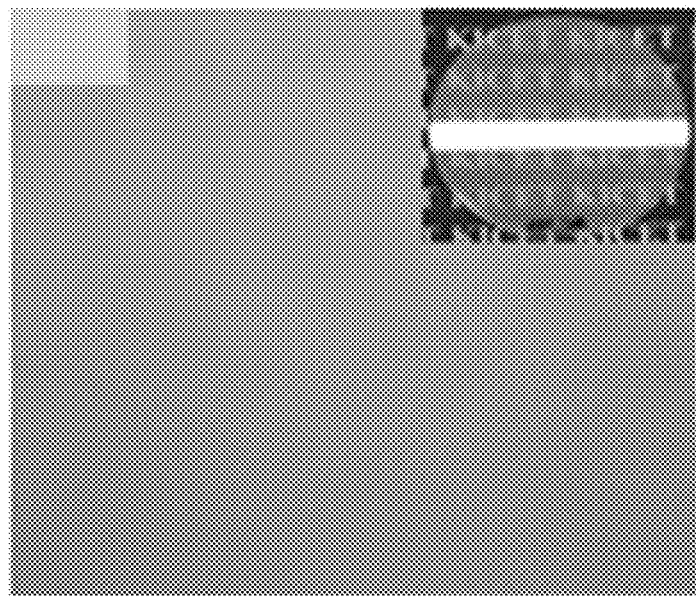
FIGS. 6A to 6D are OM and measurement photographs taken by photographing the alpha gallium oxide thin film prepared according to Examples 2 to 4 and Comparative Example 3.
Figure 6B:
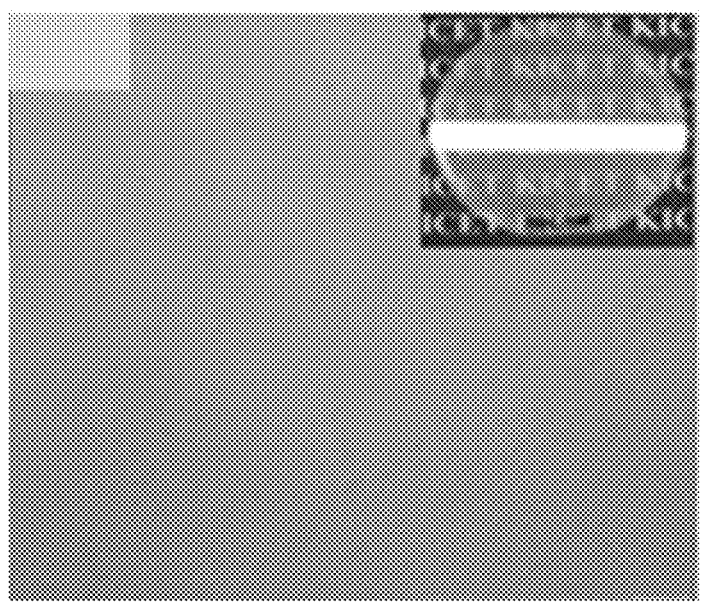
Figure 6C:
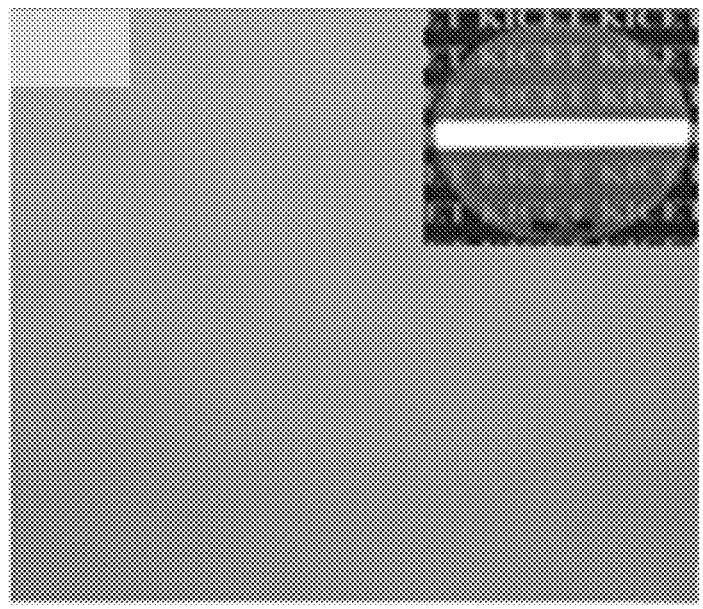
Figure 6D:
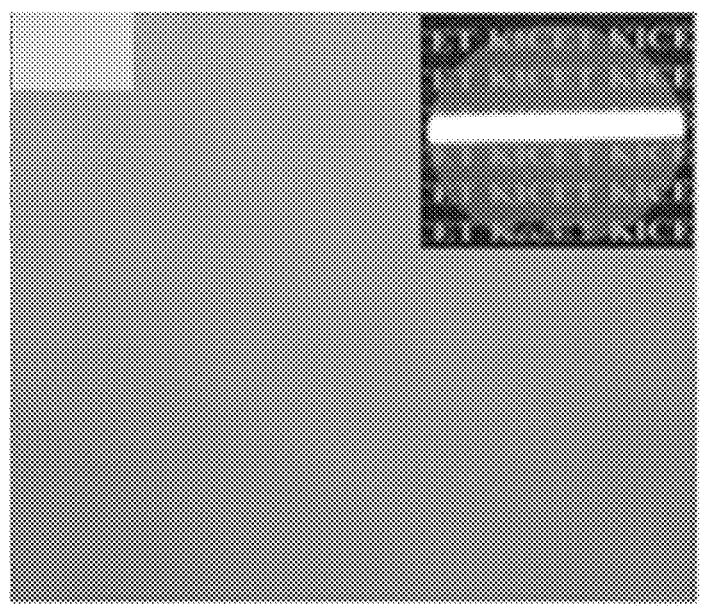

Table 1 shows the evaluation results of the electrical properties of the alpha gallium oxide thin film prepared according to Comparative Example 1, and Table 2 shows the evaluation results of the electrical properties of the alpha gallium oxide thin film prepared according to Example 1. In addition, FIGS. 5A to 5C are OM and measurement photographs taken by photographing the alpha gallium oxide thin film prepared according to Example 1 and Comparative Examples 1 to 2.

On the other hand, it was confirmed that a large amount of defects was occurred on the surface of the alpha gallium oxide prepared according to Comparative Examples 1 to 2.

As can be seen from the above experimental results, there is a problem that the electrical properties are not stable with the general annealing process or rapid heat treatment (RTA) process used for dopant activation, but it can be found that stable results can be obtained when performing in-situ annealing in the $N_2$ gas atmosphere at the same time as the formation of the doped layer is finished.

This is because it maximizes the dopant activation effect as well as the rearrangement effect of the lattice in the grown epitaxial when in-situ annealing is performed in the $N_2$ gas atmosphere as soon as the formation of the doped layer is finished.

FIGS. 6A to 6D are OM and measurement photographs taken by photographing the alpha gallium oxide thin film prepared according to Examples 2 to 4 and Comparative Example 3.

As shown in FIGS. 6A to 6D, in order to examine the effect of the in-situ annealing on the alpha gallium oxide prepared according to Examples 2 to 4 and Comparative Example 3 in more detail, the effect of each was compared by subdividing the in-situ annealing treatment time while supplying 5 sccm of $SiH_4$ during doping treatment.

As a result of examining the OM and the measurement photographs, the alpha gallium oxide thin film prepared according to Examples 2 to 4 did not have any changes on the surface of the thin film when compared to the alpha gallium oxide thin film prepared according to Comparative Example 3.

TABLE 1

| Classification | 1st | 2nd | 3rd | 4th | 5th |
|---|---|---|---|---|---|
| Carrier concentration | −1.5491E+18/cm³ | −2.5577E+18/cm³ | −2.8556E+18/cm³ | −3.1651E+18/cm³ | −1.5576E+18/cm³ |
| Carrier mobility | 1.5011E+03 cm²/V · s | 7.8792E+04 cm²/V · s | 670.01036 cm²/V · s | 110.43587 cm²/V · s | 1.3883E+03 cm²/V · s |

TABLE 2

| Classification | 1st | 2nd | 3rd | 4th | 5th |
|---|---|---|---|---|---|
| Carrier concentration | −1.6E+18/cm³ | −2.6E+18/cm³ | −1.26E+18/cm³ | — | — |
| Carrier mobility | 9.32 cm²/V · s | 6.83 cm²/V · s | 12.27 cm²/V · s | — | — |

As shown in Tables 1 and 2, in the case of the alpha gallium oxide thin film prepared according to Example 1 and Comparative Examples 1 to 2, it was confirmed that there was a marked difference in stability when comparing the electrical properties, even though they were grown under substantially the same growth conditions except whether or not the in-situ annealing was performed.

That is, in the case of Comparative Example 1 in which the in-situ annealing was not performed, it was confirmed that the reliability of the measured value for the electrical characteristics was low.

On the other hand, in the case of Example 1 in which at the same time as the formation of the doped layer was finished, the in-situ annealing was performed in the $N_2$ gas atmosphere, it was confirmed that the reliability of the measured value was high because there was no significant change in electrical characteristics.

In addition, as shown in FIGS. 5A to 5C, it was confirmed that the alpha gallium oxide prepared according to Example 1 maintained the condition at the time of growth without changes in the surface after the in-situ annealing.

Figure 7:
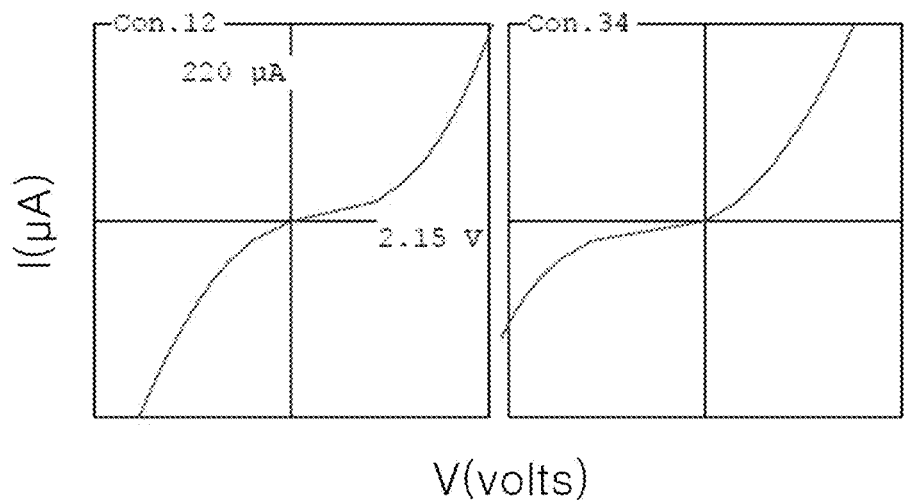
FIG. 7 is a graph showing the current-voltage measurement result of the alpha gallium oxide thin film prepared according to Example 2.
Figure 8:
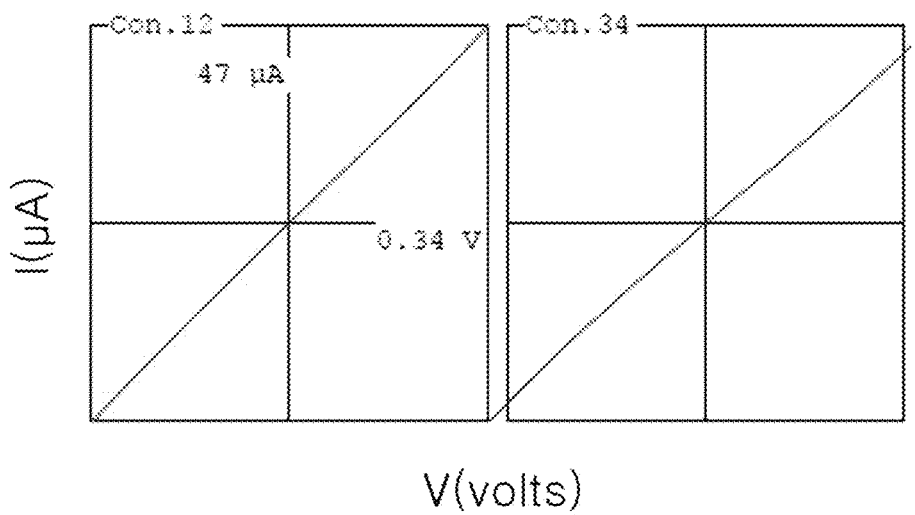
FIG. 8 is a graph showing the current-voltage measurement results of the alpha gallium oxide thin film prepared according to Example 3.
Figure 9:
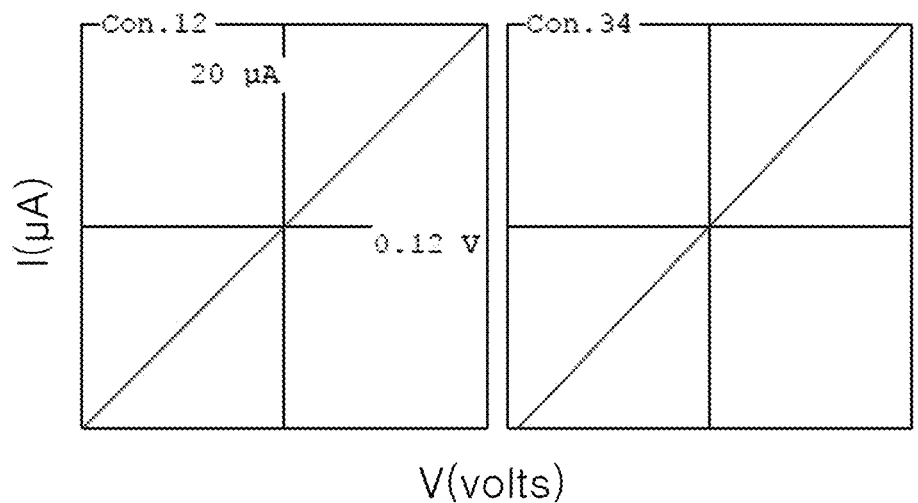
FIG. 9 is a graph showing the current-voltage measurement result of the alpha gallium oxide thin film prepared according to Example 4.
Figure 10:
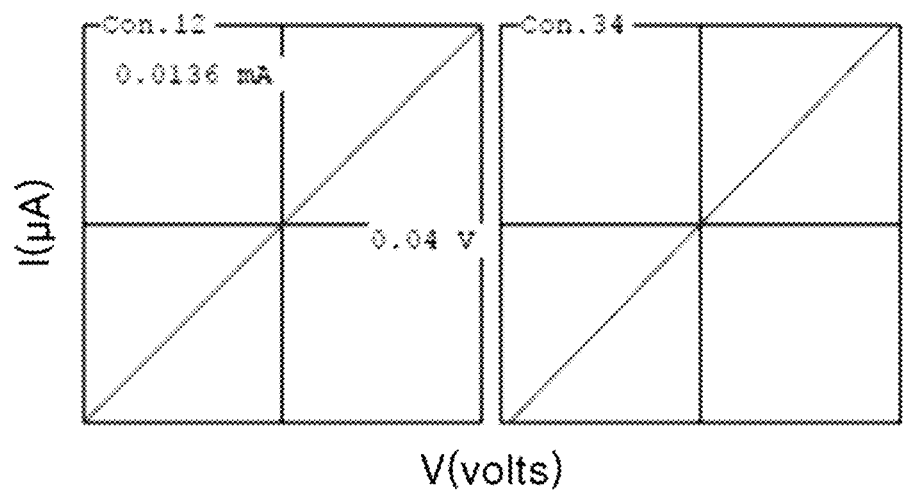
FIG. 10 is a graph showing the current-voltage measurement result of the alpha gallium oxide thin film prepared according to Example 5.

On the other hand, Table 3 shows the evaluation results of the electrical property of the alpha gallium oxide thin film prepared according to Examples 2 to 5. In addition, FIG. 7 is a graph showing the current-voltage measurement result of the alpha gallium oxide thin film prepared according to Example 2, and FIG. 8 is a graph showing the current-voltage measurement result of the alpha gallium oxide thin film prepared according to Example 3. In addition, FIG. 9 is a graph showing the current-voltage measurement result of the alpha gallium oxide thin film prepared according to Example 4, and FIG. 10 is a graph showing the current-voltage measurement result of the alpha gallium oxide thin film prepared according to Example 5.

TABLE 3

| Classification | Carrier concentration | Carrier Mobility |
|---|---|---|
| Example 2 | −1.080E+19/cm³ | 15.8 cm²/V · s |
| Example 3 | −5.289E+18/cm³ | 6.05 cm²/V · s |
| Example 4 | −3.896E+18/cm³ | 3.74 cm²/V · s |
| Example 5 | −3.43E+18/cm³ | 55.1 cm²/V · s |

As shown in Table 3 and FIGS. 7 to 10, it was confirmed that the carrier concentration and the carrier mobility were decreased in the alpha gallium oxide thin film prepared according to Examples 2 to 5 in which in-situ annealing was performed for 10 minutes, 15 minutes, and 20 minutes as the in-situ annealing treatment time increased.

In addition, with the current-voltage measurement results, it was confirmed that the alpha gallium oxide thin film prepared according to Example 5 in which the in-situ annealing was performed for 10 minutes exhibited the most stable curve.

This means that 10 minutes of energy required for dopant activation is most appropriate. However, it may be determined that the number of vacancies counted when measuring the electrical characteristics is decreased due to the filling of vacancies in epitaxial growth by receiving activation energy.

As can be seen from the above experimental results, it is confirmed that the in-situ annealing is more effective than general annealing or rapid heat treatment (RTA) process in supplying energy for dopant activation, and the result is stable.

Although the above has been described with reference to the embodiments of the present invention, various changes or modifications can be made at the level of those of ordinary skill in the art to which the present invention pertains. Such changes and modifications may be said to belong to the present invention as long as they do not depart from the scope of the technical idea provided by the present invention. Therefore, the scope of the present invention should be determined by the claims set forth below.

REFERENCE SIGNS LIST

S110: Step for growing a buffer layer
S120: Step for an epitaxial growth and doping
S130: Step for an in-situ annealing
S210: Step for growing a buffer layer
S220: Step for first growth
S230: Step for second growth
S240: Step for an in-situ annealing

What is claimed is:

1. A method of manufacturing a gallium oxide thin film for a power semiconductor using a dopant activation technology comprising the steps of:
   (a) growing a buffer layer on a substrate;
   (b) growing a doped layer by flowing a doping gas while growing an alpha gallium oxide thin film on the buffer layer by epitaxial growth; and
   (c) performing an in-situ annealing of continuously annealing in an $N_2$ or Ar gas atmosphere without the doping gas and without being exposed to a room temperature at the same time as a formation of the doped layer is finished,
   wherein, in the step (b), a doping temperature is 400 to 800° C., and the doping gas supplies 5 to 20 sccm using 2,000 ppm $SiH_4$ gas, and
   in the step (c), the in-situ annealing is performed for 1 to 20 minutes under a condition of 400 to 800° C. in the same $N_2$ or Ar gas atmosphere as the doping treatment.

2. The method of claim 1, wherein the substrate uses a material different from the alpha gallium oxide thin film.

3. The method of claim 2, wherein the substrate includes any one selected from $\beta$-$Ga_2O_3$, sapphire, and a heterogeneous substrate capable of epitaxial growth.

4. The method of claim 1, wherein, in the step (b), the epitaxial growth is performed under a condition of a source temperature of 450 to 650° C. and a growth temperature of 400 to 800° C. in the $N_2$ or Ar gas atmosphere.

5. The method of claim 1, wherein, after the step (c), the alpha gallium oxide thin film has a carrier mobility of 3 to 50 $cm^2/V \cdot s$.

6. A method of manufacturing a gallium oxide thin film for a power semiconductor using a dopant activation technology comprising the steps of:
   (a) growing a buffer layer on a substrate;
   (b) growing a first growth of an alpha gallium oxide thin film on the buffer layer by epitaxial growth;
   (c) growing a doped layer by flowing a doping gas while performing a second growth of the first grown alpha gallium oxide thin film; and
   (d) performing an in-situ annealing of continuously annealing in an $N_2$ or Ar gas atmosphere without the doping gas and without being exposed to a room temperature at the same time as a formation of the doped layer is finished,
   wherein, in the step (c), a doping temperature is 400 to 800° C., and the doping gas supplies 5 to 20 sccm using 2,000 ppm $SiH_4$ gas, and
   in the step (d), the in-situ annealing is performed for 1 to 20 minutes under a condition of 400 to 800° C. in the same $N_2$ or Ar gas atmosphere as the doping treatment.

7. The method of claim 6, wherein the substrate includes any one selected from $\beta$-$Ga_2O_3$, sapphire, and a heterogeneous substrate capable of epitaxial growth.

8. The method of claim 6, wherein, in the step (b), the epitaxial growth is performed under a condition of a source temperature of 450 to 650° C. and a growth temperature of 400 to 800° C. in the $N_2$ or Ar gas atmosphere.

9. The method of claim 6, wherein, in the step of (c), the doping treatment supplies the doping gas under the same condition as a growth condition of an un-doped alpha gallium oxide thin film.

10. The method of claim 6, wherein, after the step (d), the alpha gallium oxide thin film has a carrier mobility of 3 to 50 $cm^2/V \cdot s$.

11. A method of manufacturing a gallium oxide thin film for a power semiconductor using a dopant activation technology comprising the steps of:
    (a) growing a buffer layer on a substrate of a material different from an alpha gallium oxide thin film;
    (b) growing a first growth of the alpha gallium oxide thin film on the buffer layer by epitaxial growth under a condition of a growth temperature of 400 to 800° C.;
    (c) growing a doped layer by flowing a doping gas in an $N_2$ or Ar gas atmosphere under a condition of a doping temperature of 400 to 800° C. while performing a second growth of the first grown alpha gallium oxide thin film; and
    (d) performing an in-situ annealing of continuously annealing for 1 to 20 minutes under a condition of 400 to 800° C. in the $N_2$ or Ar gas atmosphere without the doping gas and without being exposed to a room temperature at the same time as a formation of the doped layer is finished,
    wherein, in the step (c), the doping gas supplies 5 to 20 sccm using 2,000 ppm $SiH_4$ gas.

12. The method of claim 11, wherein the substrate includes any one selected from $\beta$-$Ga_2O_3$, sapphire, and a heterogeneous substrate capable of epitaxial growth.

13. The method of claim 11, wherein, in the step (b), the epitaxial growth is performed under a condition of a source temperature of 450 to 650° C. and a growth temperature of 400 to 800° C. in the $N_2$ or Ar gas atmosphere.

14. The method of claim 11, wherein, after the step (d), the alpha gallium oxide thin film has a carrier mobility of 3 to 50 $cm^2/V \cdot s$.

* * * * *